United States Patent
Bartek et al.

(10) Patent No.: US 6,407,533 B1
(45) Date of Patent: Jun. 18, 2002

(54) BATTERY TEMPERATURE STABILIZATION SYSTEM AND METHOD

(75) Inventors: David A. Bartek, Plano; Marcus L. Melane, Irving; Edward D. Johnson, Plano, all of TX (US)

(73) Assignee: Alcatel USA Sourcing, LP, Plano, TX (US)

( * ) Notice: Subject to any disclaimer, the term of this patent is extended or adjusted under 35 U.S.C. 154(b) by 0 days.

(21) Appl. No.: 09/703,073

(22) Filed: Oct. 31, 2000

(51) Int. Cl.[7] .................................................. H02J 7/04
(52) U.S. Cl. ..................................................... 320/150
(58) Field of Search ....................... 320/150; 429/7–100

(56) References Cited

U.S. PATENT DOCUMENTS

| | | | |
|---|---|---|---|
| 1,453,328 A | | 5/1923 | Smillie ........................ 454/184 |
| 4,147,299 A | | 4/1979 | Freeman ..................... 236/49.5 |
| 4,495,545 A | | 1/1985 | Dufresne et al. ........... 361/695 |
| 5,508,126 A | * | 4/1996 | Braun ............................ 429/7 |
| 5,697,840 A | | 12/1997 | Bainbridge et al. ......... 454/184 |
| 5,765,743 A | | 6/1998 | Sakiura et al. ............. 236/49.3 |
| 5,795,664 A | * | 8/1998 | Kelly ............................. 429/7 |
| 5,800,258 A | | 9/1998 | Knoop et al. ................ 454/184 |
| 5,834,132 A | * | 11/1998 | Hasegawa et al. ............ 429/62 |
| 5,960,560 A | * | 10/1999 | Stoll ............................ 34/529 |
| 6,007,942 A | * | 12/1999 | Mistry ........................ 429/100 |
| 6,024,165 A | * | 2/2000 | Melane et al. .......... 165/104.33 |
| 6,152,096 A | * | 11/2000 | Setsuda ................... 123/184.21 |
| 6,178,760 B1 | * | 1/2001 | Tanaka et al. ................ 62/154 |

* cited by examiner

*Primary Examiner*—Peter S. Wong
*Assistant Examiner*—Pia Tibbits
(74) *Attorney, Agent, or Firm*—Smith, Danamraj & Youst, PC

(57) ABSTRACT

A system and method for the stabilization of battery temperature by alternating airflow through an internal ductwork of a cabinet housing electronic equipment and circuitry. Ambient air is drawn through one or more intake vents or louvers provided with the cabinet housing. Regulated airflow through the ductwork allows the cabinet housing's thermal management system to direct either cooler ambient air during warm periods or heated air during colder periods through the cabinet to stabilize the battery temperature as well electronics equipment and circuitry housed in the cabinet. At least a portion of the heated air is expelled through one or more exhaust vents. Because no active components are used for stabilizing battery temperature, thermal regulation is achieved even during utility power outages. Further, thermal energy is provided without the possibility of igniting hydrogen gas products generated by the battery units present in the cabinet.

19 Claims, 3 Drawing Sheets

BATTERY TEMPERATURE STABILIZATION SYSTEM AND METHOD

BACKGROUND OF THE INVENTION

1. Technical Field of the Invention

The present invention relates generally to temperature stabilization techniques using passive devices. More particularly, the present invention relates to an apparatus and method for stabilizing a battery compartment's temperature, which battery compartment is provided for housing backup battery or batteries in a cabinet along with other electronic or telecommunications equipment and circuitry.

2. Description of Related Art

Various types of cabinets, housings, enclosures, etc. (collectively "housings") are used to house equipment and circuitry. In the field of telecommunications industry, it is common practice to house network equipment and circuitry in a cabinet or enclosure that is required to meet certain environmental and reliability standards. More often, the equipment and circuitry housed in the cabinet use power generated from a backup battery or batteries, typically disposed in a lower portion of the cabinet, in order to remain in operating condition during utility power outages. Accordingly, it is necessary to maintain the batteries' temperature at a relatively constant level in order to prolong their service life and ability to provide backup power during power outages.

It is known that the capacity of the batteries to provide backup power and current decreases with decreasing ambient temperature within the cabinet. Further, during operation and charging, batteries emit potentially explosive hydrogen gas and its byproducts, which must be evacuated from the cabinet. In order to evacuate the hydrogen gas and its byproducts from the cabinet, a constant flow of air through the battery compartment is necessary. Some of the existing solutions that address these concerns include operating fans or blower mechanisms to draw in outside air in an effort to remove the hydrogen gas from the cabinet. However, these solutions are not satisfactory because in the process of removing the noxious gases and byproducts, the battery compartment is exposed to outside temperatures, and during winter months, this exposure causes the batteries to quickly lose their capacity.

Thus, there is a need not only to evacuate the hydrogen gas emitted into the cabinet during operation of the batteries, but also to maintain the batteries at a uniform temperature irrespective of the changes in the ambient temperature. Known solutions to warm the batteries during colder ambient temperatures include utilizing electrically powered heater pads or radiant heaters (generally referred to as heating devices). However, these solutions are also beset with various shortcomings and deficiencies. First, heating devices require large amounts of AC electricity to generate the resistive heating required to stabilize battery temperatures during colder ambient temperature periods. Consequently, during power outages, such devices are of little use. Further, the heating devices must be operated in an open ambient environment in order to avoid the risk of sparking the potentially explosive hydrogen gas generated during operating cycles of the batteries.

Based on the foregoing, it should be appreciated that there has arisen an acute need for a method and apparatus for stabilizing the temperatures of a battery in a passive manner, thus preventing the risk of sparking the potentially hydrogen gas and its byproducts that could be generated during the operating cycles of the battery. Furthermore, it is required that such a solution be capable of stabilizing the temperature of the batteries even during AC power outages.

SUMMARY OF THE INVENTION

Accordingly, the present invention is directed to an innovative solution which provides for the stabilization of battery or battery compartment's temperature by alternating airflow through an internal ductwork of a cabinet used for housing electronic equipment and circuitry in addition to backup battery or batteries. Ambient air is drawn through one or more intake vents or louvers provided with the cabinet housing. Regulated airflow through the ductwork allows the cabinet housing's thermal management system to direct either cooler ambient air during warm periods or heated air during colder periods through the cabinet's battery compartment to stabilize the battery temperature as well electronics equipment and circuitry housed in the cabinet. At least a portion of the heated air inside the cabinet housing is expelled via one or more exhaust vents provided with the housing. Because no active components are used for stabilizing battery temperature, thermal regulation is achieved even during utility power outages. Further, thermal energy is provided without the possibility of igniting hydrogen gas products generated by the battery units present in the cabinet.

In one aspect, the present invention is directed to a battery temperature stabilization system which includes a housing having one or more intake vents and one or more exhaust vents for receiving and expelling air, respectively. A plurality of air passage ways are provided in the housing for circulating air to an electronic equipment compartment and a battery compartment disposed in the housing. The battery compartment includes at least one battery operable to provide backup power to circuitry disposed in the electronic equipment compartment. At least one heat exchanger unit is provided in the housing for transferring heat generated from electronic equipment compartment into a ductwork chamber forming a portion of the air passage ways. A plurality of dampers are provided for controlling the amount of air flow through the air passage ways and the intake/exhaust vents. In one embodiment, an air conducting unit is included in addition to or in lieu of the dampers for routing the drawn in ambient air through the ductwork chamber in one of two directions. The ambient air is first heated or warmed (i.e., thermally conditioned) by the heat exchanger before being directed to the battery compartment when the battery compartment's temperature is lower than ambient temperature. Otherwise, the ambient air is directed to flow in proximate contact with the battery compartment prior to receiving heat from the heat exchanger, thereby cooling the battery compartment.

In another exemplary embodiment of the present invention, the air conducting unit is comprised of a bi-directional fan operable to blow air in two directions. In yet another exemplary embodiment, two separate fans which are independently energized may be provided as the air conducting unit, wherein one fan is operable to blow air in one direction and the other fan operates to blow air in the opposite direction. In the presently preferred exemplary embodiments, the dampers are provided as bimetallic spring operated units that are preferably thermostatically controlled.

In another aspect, the present invention is directed to a method of passively stabilizing temperature within an enclosure including an electronic equipment compartment and a backup battery compartment. First, a select amount of ambient air is drawn into the enclosure through an intake vent. If the temperature of the battery compartment or the enclosure is greater than a select temperature, the ambient air is circulated in proximate contact with the battery compartment prior to directing the ambient air via a ductwork chamber to a heat exchanger. Preferably, the heat exchanger operates to transfer heat generated in the electronic equipment compartment. By routing cooler ambient air directly, the battery compartment's temperature in warmer ambient conditions is accordingly regulated. Otherwise, where the temperature of the battery compartment or the enclosure is lower than a predetermined temperature, the ambient air is directed via the ductwork chamber to the heat exchanger for warming the ambient air. The warmed ambient air is thereafter circulated in proximate contact with the battery compartment in order to maintain the battery compartment's temperature in cooler ambient conditions. Preferably, at least a portion of warmed ambient air may be removed from the enclosure through an exhaust vent.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
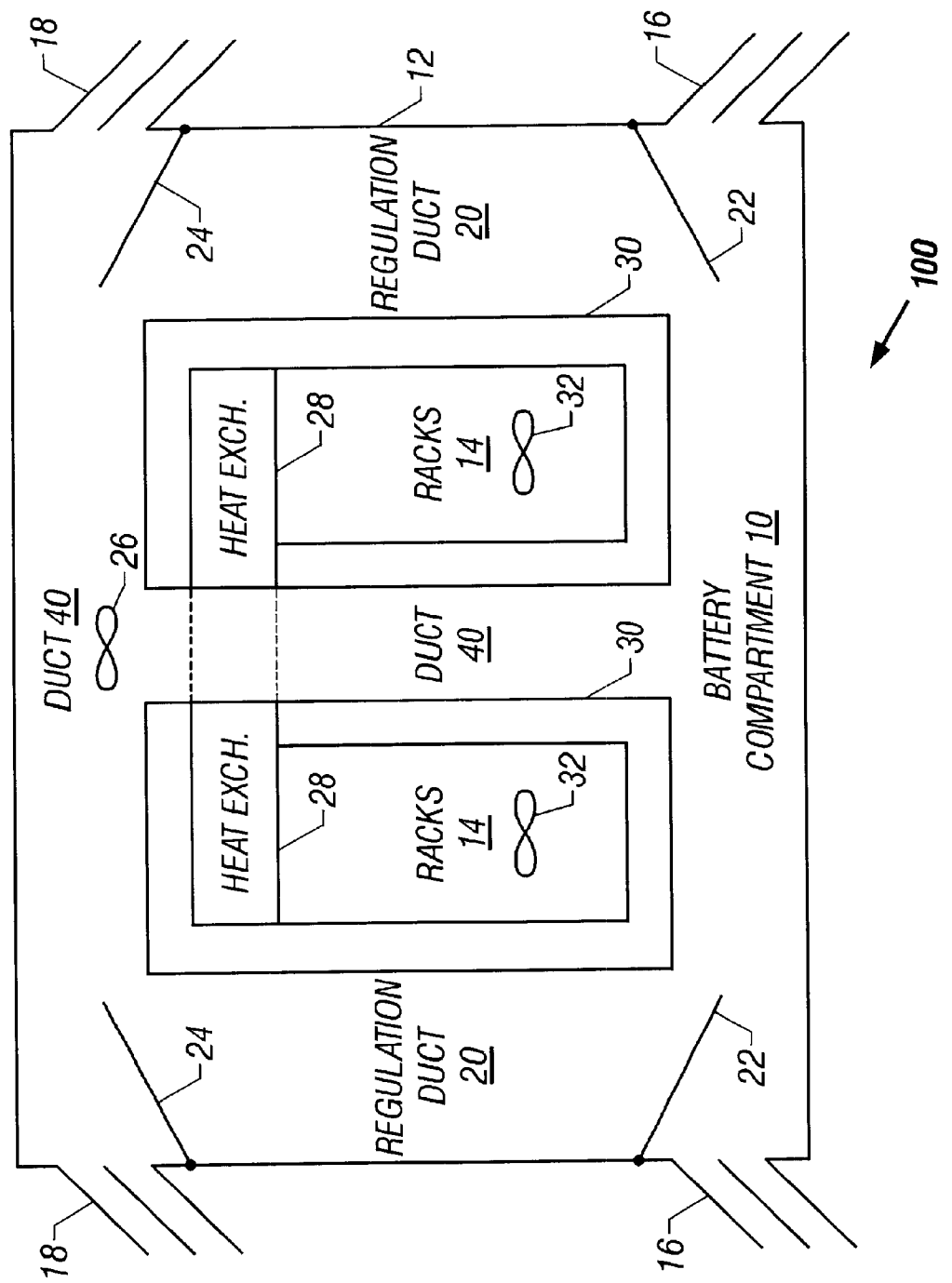
FIG. 1 illustrates an overview of the battery temperature stabilization system of the present invention.

In the drawings, like or similar elements are designated with identical reference numerals throughout the drawings, and the various elements depicted are not necessarily drawn to scale. Referring now to FIG. 1, there is shown a general overview of the battery temperature stabilization system 100 of the present invention not only for maintaining a uniform temperature of the battery/batteries, but also to expel the hydrogen gas from inside of an equipment cabinet/enclosure 12 (hereinafter referred to as cabinet 12).

In a presently preferred exemplary embodiment of the battery temperature stabilization system 100, the cabinet 12 is provided with two pairs of vents or louvers (collectively "vents"). A first pair of vents 18 are preferably disposed near the upper portion of the cabinet 12, while a second pair of vents 16 are preferably disposed near the lower portion of the cabinet 12. Vents 18 and 16 may be used to receive ambient external air into cabinet 12 as well as to expel air therefrom. The amount of external air that is drawn into the cabinet and the percentage of air expelled out through the first pair of vents 18 is controlled by a first pair of thermostatically controlled dampers 24. Likewise, the amount of air that is drawn into the cabinet and the percentage of air expelled out through the second pair of vents 16 is also controlled by a second pair of thermostatically controlled dampers 22. Accordingly, the vents are provided to be operable as either intake vents or exhaust vents. Each damper of the first and second pair of dampers may be made of a bi-metallic material, and operates by means of a spring controlled mechanism. In the embodiment depicted in FIG. 1, the operation of the first and second pair of dampers by means of a spring controlled mechanism is omitted for the sake of clarity.

The battery temperature stabilization system 100 further includes a battery compartment 10 preferably housed within the lower portion of cabinet 12. The battery compartment 10 may include one or more batteries—the selection of the number of batteries and their capacity depending on the amount of power that may be needed to power the equipment being housed within cabinet 12. Therefore, the number/type of batteries and their capacities should not be construed as a limiting factor with respect to the present invention.

Continuing to refer to FIG. 1, electronic equipment and circuitry may be disposed within racks 14 of one or more electronics compartment units 30. Each of the electronics compartment units 30 is provided with at least one heat exchanger device 28 along with an internal loop fan 32 for expelling the heat generated by electronic equipment housed within racks 14 through the heat exchanger device 28. Heat exchanger devices 28 act as an interface for expelling the heat generated by the electronic equipment and thereby cooling the electronics compartment units 30 of the cabinet 12. It is to be understood that the number of electronic compartment units 30 and the heat exchanger devices 28 as shown in FIG. 1 should not be construed as a limitation of the present invention. In fact, the electronic compartment units and the associated heat exchanger devices may vary depending upon the amount of equipment enclosed within the electronic compartment units.

External or outside air that is drawn into the cabinet 12 and the air that is to be expelled out of the cabinet 12 is routed through a plurality of air regulation or circulation ducts 20. Each of the plurality of vents 18 and 16, respectively, are capable of operation in open and closed positions, wherein the vents may be opened or closed by generally known manual or automated mechanisms or may be thermostatically controlled depending on the air temperature within the cabinet 12. Further, as will be described in greater detail hereinbelow, the opening and closing of the vents 18 and 16 is coordinated with the thermostatically controlled operation of the dampers 24 and 22 in order to achieve an effective passive thermal regulation system for stabilizing the temperature of the battery compartment inside the cabinet 12.

Furthermore, an external loop fan 26 may be used in addition to or in lieu of the dampers for conducting air through the plurality of passageways which include regulation/circulation ducts 20 and a ductwork chamber 40 disposed in the cabinet 12. External loop fan 26 may be a bi-directional fan that may be operated in one of the two directions depending on whether the battery temperature stabilization system 100 is being operated to keep the batteries warm or cold. It is also to be understood that instead of using a single fan 26 capable of operating in two directions, two different fans may also be used—each fan conducting/blowing air in a direction that is opposite to the direction of the other. In the event of AC power outages, batteries housed within compartment 10 provide power not only to the electronic equipment housed within electronic compartment units 30, but also to the various equipment and components that operate to stabilize the batteries at a uniform temperature.

Those skilled in the art should appreciate that the depiction of the battery temperature stabilization system 100 is a somewhat simplified view of a battery temperature stabilization system that may be provided in the actual practice of the present invention. Numerous additional components or equipment may be contained within the cabinet 12, with various arrangements of the air passageways and assorted ductwork. Moreover, the organization of the battery temperature stabilization system may differ from that depicted in FIG. 1 which is, accordingly, intended to be merely illustrative and not limiting of the present invention.

Figure 2:
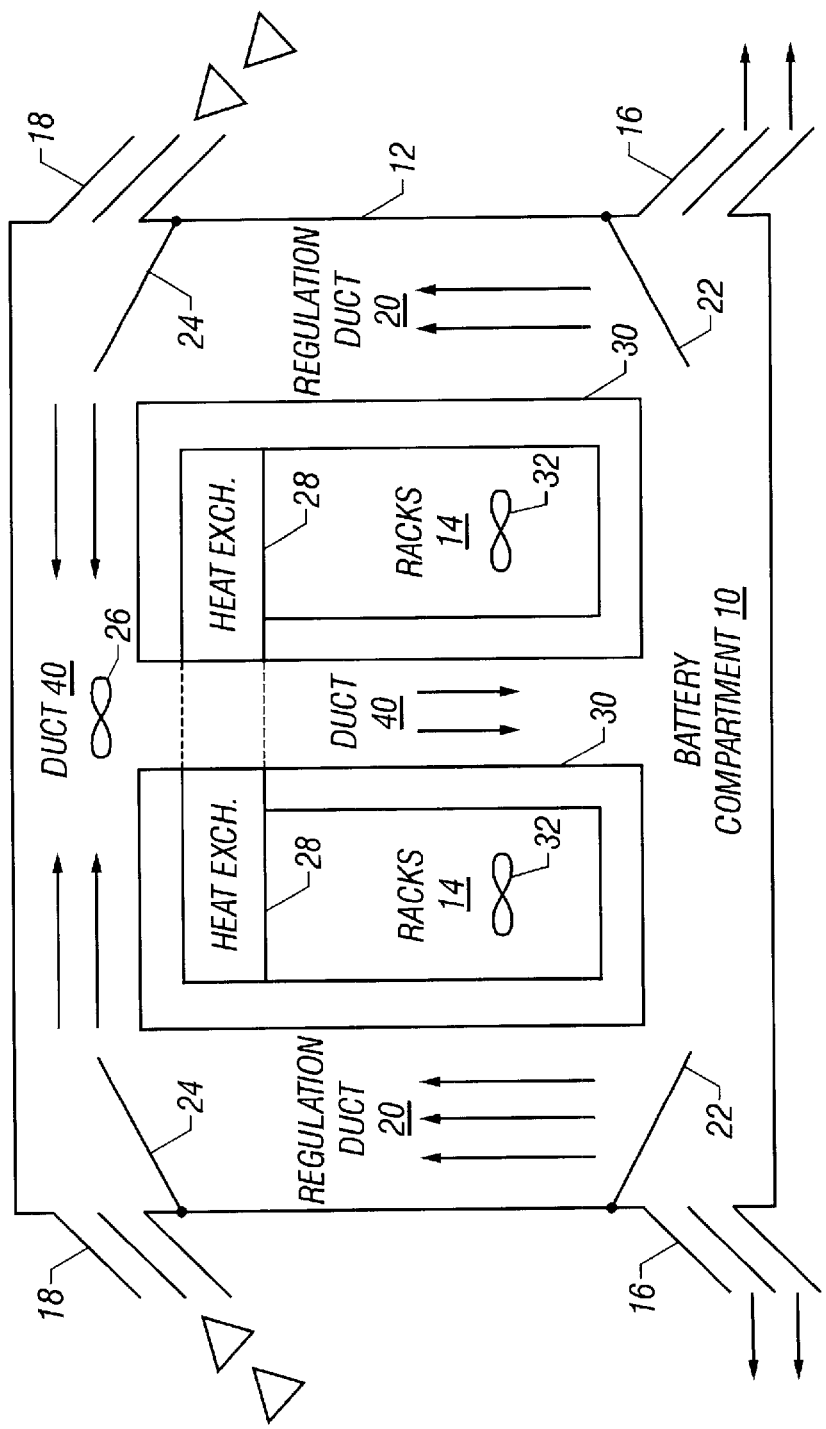
FIG. 2 illustrates the operation of the battery temperature stabilization system during colder cabinet temperatures thus requiring to keep the batteries warm.

Against the above description of FIG. 1, the operation of the battery temperature stabilization system may be better understood. Referring now to FIG. 2, depicted therein is the operation of the battery temperature stabilization system during cold ambient conditions and thus requiring to warm the batteries disposed in compartment 10 of cabinet 12. During colder periods, when the cabinet temperature drops, ambient external air is drawn into the cabinet 12 through vents 18 disposed in the upper portion of the cabinet 12 while the second pair of vents 16 are closed. The drawn in external air is routed through ductwork 40 and through the heat exchanger devices 28, thereby cooling the electronics compartment unit 30.

In the process of cooling the electronics compartment unit 30, the external air passing through the ductwork 40 gathers heat emitted by the electronics compartment unit 30 through the heat exchanger device 28. The heated air is then routed through the ductwork 40, from the upper portion to the lower portion of the cabinet 12, into and through the battery compartment 10 disposed in the lower portion of the cabinet 12. The heated air passing through the battery compartment 10 is routed through regulation ducts 20 to the upper portion of the cabinet 12 where it mixes with a percentage of the drawn in external ambient air before it is routed back again through the heat exchanger devices 28. After passing through the heat exchanger device, vents 16 are opened and a percentage of the heated air is vented or exhausted out of the cabinet 12 through vents 16, taking along with it gaseous byproducts that may have been generated during the operating cycles of the batteries.

The second pair of vents 16 are closed once a predetermined amount of heated air along with hydrogen gas is vented or exhausted out of the cabinet 12. A thermostat may be used to maintain/stabilize battery temperature. A combination of thermostatically controlled devices may be used to energize the appropriate set of fans, vents, dampers for a given set of ambient conditions within the cabinet. The process of drawing in external air through vents 18 and routing the heated air through ductwork 40, recirculating the heated air through regulation ducts 20, and expelling the heated air along with any hydrogen gas that may have been emitted ensures maintaining the temperature of the batteries disposed in battery compartment 10 in a stable and risk-free manner.

During the above described process of warming the batteries, the external loop fan 26 operates to blow or conduct external air from the upper portion of cabinet 12 through the ductwork 40 towards the battery compartment 10. Further, during the process of recirculating heated air through recirculating ducts 20, the first and the second pair of dampers 24 and 22, respectively, are held in an open condition as illustrated in FIG. 2, thereby permitting heated air to be recirculated through the recirculation ducts 20 towards the battery compartment 10. As pointed out above, each of the first and second pair of dampers 24 and 22 may be spring-operated and may be thermostatically controlled for appropriately opening and closing of the same in order to facilitate the recirculation of the air mixture in cabinet 12. It should be appreciated by one of ordinary skill in the art that multiple variations of damper mechanisms may be used in combination of vents or louvers in order to control the drawing in of external air into cabinet 12 and expelling air from the cabinet 12 into external atmosphere without departing from the spirit and scope of the present invention.

Figure 3:
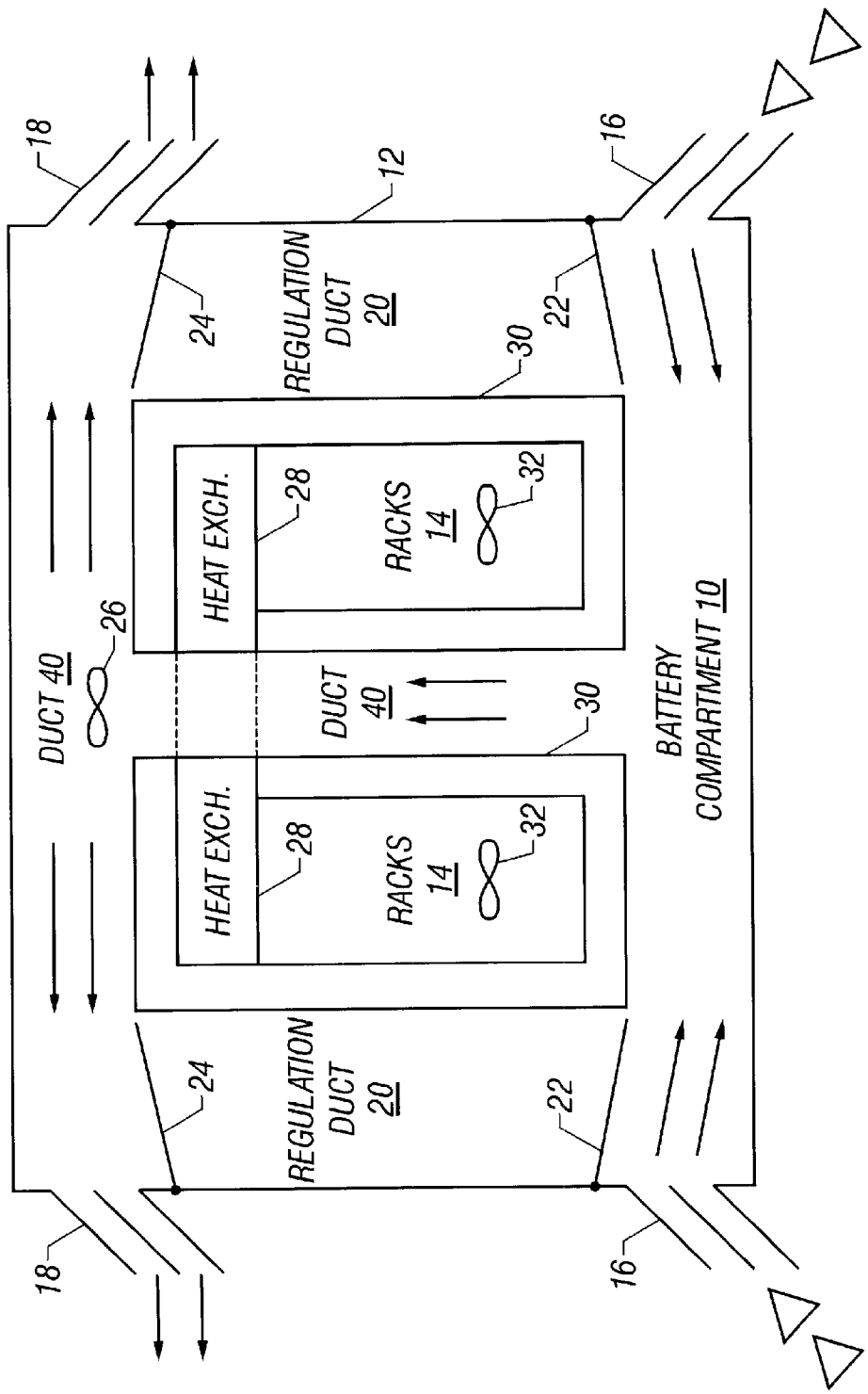
FIG. 3 illustrates the operation of the battery temperature stabilization system during warmer cabinet temperatures and thus requiring to cool the batteries.

FIG. 3 illustrates the operation of the battery temperature stabilization system during warm ambient conditions and thus requiring to cool the batteries disposed in compartment 10 of cabinet 12. During warm ambient periods, when the cabinet temperature raises, ambient external air is drawn into the cabinet 12 through the second pair of vents or louvers 16 disposed in the lower portion of cabinet 12 while the first pair of vents or louvers 18 are held in an open condition. External air drawn into cabinet 12 is passed through the battery compartment 10 and through the ductwork 40 and across the heat exchanger devices 28 thereby cooling the batteries disposed in the battery compartment 10 as well as the electronics compartment 30 contained within cabinet 12. As the external air passes through the heat exchangers 28 through ductwork 40, it extracts heat from the heat exchangers 28. The heated air may then be routed, from the lower portion of cabinet 12 through ductwork 40 to the upper portion of cabinet 12, to the first pair of vents/lovers 18 where it exits the cabinet 12.

During the process of cooling the batteries located in the battery compartment 10, external loop fan 26 operates to draw external air from the lower portion of the cabinet 12 through the battery compartment 10 and across heat exchangers 28 to the upper portion of the cabinet 12. Further, during the process of conducting external air from the lower portion to the upper portion of the cabinet 12 through ductwork 40, the first and the second pair of dampers 24 and 22, respectively, are held in a closed position as illustrated in FIG. 3, thereby preventing the heated air from entering the recirculation ducts 20 and recirculating into the battery compartment 10.

As illustrated above, the present invention allows for the stabilization of battery temperatures by alternating the airflow through various intake and exhaust vents or louvers. This process of alternating the airflow permits the cabinet's thermal management system to direct either cooler external air during warmer periods or heated air during colder ambient periods through the cabinet to stabilize the temperature of the batteries.

The thermal management system of the cabinet may include a plurality of vents, a plurality of damper mechanisms or other means to achieve the similar purpose of controlling the intake of external air and exhausting air from the cabinet 12, at least one heat exchanger device, a plurality of air circulation and regulation ducts, and at least one fan or a blowing mechanism in order to conduct air through the plurality of air circulation ducts or passages, and at least one battery disposed in a housing in order to provide backup power during AC outages. Since the batteries provide power to the equipment housed in electronics compartment units 30 during AC power outages, the heat generated by the electronic equipment disposed in electronics compartment units 30 may be captured and recirculated through recirculation ducts 20 in order to keep the batteries in a warm condition in winter months.

The present invention thus provides passive means to utilize available thermal energy to warm the batteries, and makes the thermal energy available even during utility AC power outages. Further, the thermal energy may provided without the possibility of igniting any trapped hydrogen gas byproducts that may have been generated during the production/charging cycles of the batteries. The present invention thus has the potential of reducing cost by eliminating expensive heating devices, while increasing performance and reliability.

It is believed that the operation and construction of the present invention will be apparent from the foregoing Detailed Description. While the apparatus and method shown and described have been characterized as being preferred, it should be readily understood that various changes, modifications and enhancements could be made therein without departing from the scope of the present invention as set forth in the following claims. For example, it is possible to use a variable number of vents at different positions in the cabinet housing and appropriate damper mechanisms and associated control means for controlled opening and closing of the damper mechanisms. It is further possible to vary the selection, number and placement of heat exchanger devices. Depending on the requirements and the capacity of the subject equipment, the number of vents or louvers, damper mechanisms, heat exchanger devices, and the number of batteries to provide backup power may all be varied.

In addition, although the exemplary embodiments depicted in FIGS. 1 through 3 show the external loop fan arrangement as well as damper mechanisms for routing the air inside the cabinet, it should be clearly understood that the fans and dampers may be placed independently for that purpose. That is, the fan blower mechanism may be provided in addition to or in lieu of the damper mechanism for regulating air circulation within the passage ways of the cabinet.

Further, although the motivation for the present invention has been set forth in the context of telecommunications equipment, the teachings hereof may also be practiced in conjunction with any equipment disposed in an enclosure wherein backup power is provided by means of batteries in the event of AC power outages and wherein the temperature of such batteries is required to be stabilized in a passive manner while providing for the removal of potentially harmful hydrogen gas byproducts from the enclosure. Accordingly, those skilled in the art should readily appreciate that these and other variations, additions, modifications, enhancements, et cetera, are deemed to be within the ambit of the present invention whose scope is determined solely by the following claims.

What is claimed is:

1. A battery temperature stabilization system, comprising:
   a housing including at least one intake vent and at least one exhaust vent;
   a plurality of air passage ways for circulating air to an electronic equipment compartment and a battery compartment disposed in said housing, said battery compartment including at least one battery operable to provide backup power to circuitry disposed in said electronic equipment compartment;
   at least one heat exchanger unit operable for transferring heat from said electronic equipment compartment into a ductwork chamber forming a portion of said air passage ways; and
   a plurality of dampers controlling air flow through said air passage ways and said intake and exhaust vents, said dampers for routing air through said ductwork chamber in one of two directions, wherein ambient air drawn in is first heated by said heat exchanger before being directed to said battery compartment when said battery compartment's temperature is lower than ambient temperature, otherwise said ambient air is directed to flow in proximate contact with said battery compartment prior to receiving heat from said heat exchanger thereby cooling said battery compartment.

2. The battery temperature stabilization system as set forth in claim 1, wherein said dampers are spring operated.

3. The battery temperature stabilization system as set forth in claim 2, wherein said dampers are thermostatically controlled.

4. The battery temperature stabilization system as set forth in claim 3, wherein said electronic equipment compartment includes an internal loop fan.

5. The battery temperature stabilization system as set forth in claim 4, further comprising a bi-directional external loop fan.

6. The battery temperature stabilization system as set forth in claim 4, further comprising two independently energized external loop fans capable of blowing air in opposite directions relative to each other.

7. The battery temperature stabilization system as set forth in claim 4, wherein said electronic equipment compartment comprises a plurality of racks containing telecommunications components.

8. The battery temperature stabilization system as set forth in claim 4, wherein said batter y compartment is positioned at a lower portion of said housing relative to said electronic equipment compartment.

9. The battery temperature stabilization system as set forth in claim 4, wherein said air passage ways includes a circulation duct portion for recirculating air warmed by said heat exchanger throughout said housing.

10. A method of passively stabilizing temperature within an enclosure including an electronic equipment compartment and a backup battery compartment, comprising the steps of:
    receiving a select amount of ambient air into said enclosure through an intake vent;
    determining said battery compartment's temperature;
    if said battery compartment's temperature is greater than a select temperature, circulating said ambient air in proximate contact with said battery compartment prior to directing said ambient air via a ductwork chamber to a heat exchanger operating to transfer heat generated in said electronic equipment compartment, thereby regulating said battery compartment's temperature in warmer ambient conditions; and
    otherwise, directing said ambient air via said ductwork chamber to said heat exchanger for warming said ambient air, said warmed ambient air thereafter circulating in proximate contact with said battery compartment in order to maintain said battery compartment's temperature in cooler ambient conditions.

11. The method of passively stabilizing temperature within an enclosure as set forth in claim 10, wherein said step of circulating said ambient air in proximate contact with said battery compartment is facilitated by a damper system.

12. The method of passively stabilizing temperature within an enclosure as set forth in claim 10, wherein said step of directing said ambient air via said ductwork chamber to said heat exchanger is facilitated by a damper system.

13. The method of passively stabilizing temperature within an enclosure as set forth in claim 10, further including the step of recirculating a quantity of warmed ambient air via a circulation duct disposed in said enclosure when said battery compartment's temperature is lower than said select temperature.

14. The method of passively stabilizing temperature within an enclosure as set forth in claim 10, further including the step of conducting said ambient air in said ductwork chamber in one of two directions.

15. The method of passively stabilizing temperature within an enclosure as set forth in claim 14, wherein said step of conducting said ambient air in said ductwork chamber in one of two directions is facilitated by a bi-directional fan.

16. The method of passively stabilizing temperature within an enclosure as set forth in claim 14, wherein said step of conducting said ambient air in said ductwork chamber in one of two directions is facilitated by a first fan for directing said ambient air in said ductwork chamber in one direction and a second fan for directing said ambient air in said ductwork chamber in opposite direction.

17. The method of passively stabilizing temperature within an enclosure as set forth in claim 10, wherein said select temperature comprises ambient air temperature.

18. The method of passively stabilizing temperature within an enclosure as set forth in claim 10, further including the step of removing a quantity of warmed ambient air from said enclosure through an exhaust vent.

19. A battery temperature stabilization system, comprising:

a housing including at least one intake vent and at least one exhaust vent;

a plurality of air passage ways for circulating air to an electronic equipment compartment and a battery compartment disposed in said housing, said battery compartment including at least one battery operable to provide backup power to circuitry disposed in said electronic equipment compartment;

at least one heat exchanger unit operable for transferring heat from said electronic equipment compartment into a ductwork chamber forming a portion of said air passage ways; and means for controlling air flow through said air passage ways and said intake and exhaust vents, said means operating to route air through said ductwork chamber in one of two directions, wherein ambient air drawn in is first heated by said heat exchanger before being directed to said battery compartment when said battery compartment's temperature is lower than ambient temperature, otherwise said ambient air is directed to flow in proximate contact with said battery compartment prior to receiving heat from said heat exchanger.

* * * * *